US009564319B2

(12) United States Patent
Jin

(10) Patent No.: US 9,564,319 B2
(45) Date of Patent: Feb. 7, 2017

(54) METHOD OF FABRICATING TRANSIENT SEMICONDUCTOR BASED ON SINGLE-WALL NANOTUBE

(71) Applicant: INCHEON UNIVERSITY INDUSTRY ACADEMIC COOPERATION FOUNDATION, Incheon (KR)

(72) Inventor: Sung-Hun Jin, Gyeonggi-do (KR)

(73) Assignee: Incheon University Industry Academic Cooperation Foundation, Incheon (KR)

( * ) Notice: Subject to any disclaimer, the term of this patent is extended or adjusted under 35 U.S.C. 154(b) by 0 days.

(21) Appl. No.: 15/152,121

(22) Filed: May 11, 2016

(65) Prior Publication Data

US 2016/0365247 A1 Dec. 15, 2016

(30) Foreign Application Priority Data

Jun. 11, 2015 (KR) .......................... 10-2015-0082379

(51) Int. Cl.
*H01L 29/76* (2006.01)
*H01L 21/02* (2006.01)
(Continued)

(52) U.S. Cl.
CPC ..... *H01L 21/02606* (2013.01); *H01L 21/0234* (2013.01); *H01L 21/02164* (2013.01); *H01L 21/02269* (2013.01); *H01L 21/02274* (2013.01); *H01L 21/02422* (2013.01); *H01L 21/02664* (2013.01); *H01L 21/28556* (2013.01);
(Continued)

(58) Field of Classification Search
CPC .................... H01L 2924/1306; H01L 21/7806; H01L 24/03; H01L 24/98; H01L 31/1896
See application file for complete search history.

(56) References Cited

U.S. PATENT DOCUMENTS

2005/0208304 A1*  9/2005  Collier ................... B01J 23/745
                                                              428/403
2013/0344679 A1* 12/2013  Lee .......................... H01L 24/98
                                                              438/458

FOREIGN PATENT DOCUMENTS

KR   10-2007-0030661 A1   3/2007
KR   10-2010-0120295 A1   4/2016

OTHER PUBLICATIONS

Published in Applied Physics Letters, 105, 013506 (2014) on Jul. 8, 2014.

* cited by examiner

*Primary Examiner* — Jaehwan Oh
(74) *Attorney, Agent, or Firm* — Heslin, Rothenberg, Farley & Mesiti; George S. Blasiak

(57) ABSTRACT

A method of fabricating a transient semiconductor based on a single-wall nanotube includes stacking a thermal oxide layer on a silicon substrate and depositing a nickel thin layer on the thermal oxide layer, depositing an oxide layer on the nickel thin layer, depositing a metallic layer on the oxide layer, and patterning the metallic layer to form a gate electrode, depositing a gate insulating layer on the gate electrode, changing a surface of the gate insulating layer into a hydrophilic surface, and washing and drying the gate insulting layer, coating a single-wall nanotube on the hydrophilic surface of the gate insulating layer, forming source and drain electrodes by forming a contact opening with respect to the gate insulating layer, attaching a thermal release tape after removing a surrounding single-wall nano- (Continued)

tube, performing a transfer onto a polyvinyl alcohol thin layer after etching the nickel thin layer, and releasing the thermal release.

14 Claims, 14 Drawing Sheets

(51) Int. Cl.
| | | |
|---|---|---|
| *H01L 29/775* | (2006.01) | |
| *H01L 29/778* | (2006.01) | |
| *H01L 21/683* | (2006.01) | |
| *H01L 21/3205* | (2006.01) | |
| *H01L 21/285* | (2006.01) | |
| *H01L 21/311* | (2006.01) | |
| *H01L 21/3065* | (2006.01) | |
| *H01L 29/06* | (2006.01) | |
| *H01L 29/66* | (2006.01) | |

(52) U.S. Cl.
CPC .... *H01L 21/3065* (2013.01); *H01L 21/31116* (2013.01); *H01L 21/32051* (2013.01); *H01L 21/6835* (2013.01); *H01L 29/0669* (2013.01); *H01L 29/66477* (2013.01); *H01L 29/775* (2013.01); *H01L 29/7789* (2013.01); *H01L 2221/68363* (2013.01); *H01L 2221/68381* (2013.01)

METHOD OF FABRICATING TRANSIENT SEMICONDUCTOR BASED ON SINGLE-WALL NANOTUBE

CROSS-REFERENCE TO RELATED APPLICATION

This application claims priority to Korean Patent Application No. 10-2015-0082379 filed on Jun. 11, 2015, and all the benefits accruing therefrom under 35 U.S.C. §119, the contents of which is incorporated by reference in its entirety.

BACKGROUND OF THE INVENTION

1. Field of the Invention

The present invention relates to a method of fabricating a semiconductor, and more particularly to a method of fabricating a transient semiconductor based on a single-wall nanotube, capable of fabricating a low-voltage, high-gain, and full-swing transistor by transferring a semiconductor, which has a single-wall nanotube electron structure having a physically transient property that all components are decomposed under water, into a polyalcohol thin layer having a predetermined molecular weight.

2. Description of the Related Art

In general, transient electronics refers to a technology of designing included devices to be physically lost partially or entirely under the control after the devices have provided intrinsic functions thereof.

The applications of the transient electronics range from a bio-degradable implant to a hardware security memory system, the loss of an environmental sensor, or a household appliance having a reduced waste steam.

The technology has created opportunities of studies on an electronic material and a device design and studies on a breakthrough micro/nano-technology.

Meanwhile, a silicon nano-membrane requires different materials, such as zinc oxide ($ZnO_6$) and organic/bio-polymer. On the contrary, the silicon nano-membrane has an advantage in the above studies since the dissolution characteristic by hydrolysis, a stable reproduction characteristic, and a superior electrical characteristic are represented in bio-liquid, ground water, seawater Accordingly, the need for the manufacturing of a transient semiconductor based on a single-wall nanotube by utilizing the transient electronics is emerged, in which the transient electronics is utilized based on controlled dissolution and decomposition with an ability of forming a field effect transistor (FET) in a single wall nanotube network, an ability of forming a percolating network having a low area range in a nano-scale dimension of the single-wall nanotube, and an ability of forming a superior electrical characteristic and capacitance for network distribution due to the loss of a support substrate.

However, although the single-wall nanotube network has been extensively studied in an individual device and an integrated circuit, the single-wall nanotube network has never been studied as a transient material for a transient electronic system.

Therefore, the present inventor has invented a method of fabricating a transient semiconductor by combining a single-wall carbon nanotube with a substrate including water-soluble dielectric and metal and a transient boot strap single-wall carbon nanotube inverter, to represent an improved noise margin and logic swing when comparing with a non-transient inverter.

Meanwhile, a full-swing electrical characteristic based on DC and pulse mode schemes produces the intrinsic effect thereof as well as the effect of a contact formed using a transient metal.

However, according to the related art, when one and two dimensional materials are formed in contact with an insulating layer, traps having various energies are formed, so that device performance and reliability may be significantly degraded. In addition, according to the related art, when a diode-connected load is used, threshold voltage drop may not remarkably reduce a logic swing and a noise margin at a source terminal.

Therefore, in order to solve the problems occurring when a nanomaterial makes contact with an insulating layer according to the related art, the present inventor suggests a method of fabricating a transient semiconductor based on a single-wall nanotube, enabling an inverter including a transistor having the high mobility and on/off rate to perform full swing with a high gain under low voltage by transferring a semiconductor, which has a single-wall nanotube electron structure decomposed under water, into a polyalcohol thin layer having a predetermined molecular weight.

As prior arts, there are KR 10-2010-0120295 A1 and KR 10-2007-0030661 A1.

SUMMARY OF THE INVENTION

An object of the present invention is to provide a method of fabricating a transient semiconductor based on a single-wall nanotube, enabling an inverter including a transistor having the high mobility and on/off rate to perform full swing with a high gain under low voltage by transferring a semiconductor, which has a transient single-wall nanotube electron structure decomposed under water, into a polyalcohol thin layer having a predetermined molecular weight.

The objects of the present invention are not limited to the above-mentioned objects, and other objects will be clearly understood from the following description by those skilled in the art.

In order to accomplish the above object, there is provided a method of fabricating a transient semiconductor based on a single-wall nanotube, which includes (a) stacking a thermal oxide layer on a silicon substrate and depositing a nickel thin layer on the thermal oxide layer, (b) depositing an oxide layer on the nickel thin layer through a plasma enhanced chemical vapor deposition scheme, (c) depositing a metallic layer on the oxide layer through an electron-beam deposition scheme, and patterning the metallic layer through a photo-lithography scheme to form a gate electrode, (d) depositing a gate insulating layer on the gate electrode through the plasma enhanced chemical vapor deposition scheme, (e) changing a surface of the gate insulating layer into a hydrophilic surface through a plasma treatment or an ultra-violet ozone treatment, and washing and drying the gate insulting layer, (f) coating a single-wall nanotube on the hydrophilic surface of the gate insulating layer, (g) forming source and drain electrodes by forming a contact opening through a reactive ion etching scheme with respect to the gate insulating layer, (h) attaching a thermal release tape after removing a surrounding single-wall nanotube through the reactive ion etching scheme, (i) performing a transfer onto a polyvinyl alcohol thin layer after etching the nickel thin layer using an iron chloride solution, and (j) releasing the thermal release tape on a thermal plate.

The coating of the single-wall nanotube on the hydrophilic surface of the gate insulating layer includes pressing a tape having a circuit on an opposite surface of the polyvinyl alcohol thin layer, and coating polymethylmethacrylate (PDMS) onto a glass slide.

In the coating of the single-wall nanotube on the hydrophilic surface of the gate insulating layer, a nanowire having a one-dimensional structure and a semiconductor characteristic is coated instead of the single-wall nanotube.

The nickel thin layer has a thickness in a range of 250 nm to 350 nm.

The forming of the source and drain electrodes by forming the contact opening through the reactive ion etching scheme with respect to the gate insulating layer includes applying a poly-L-lysine solution, exposing the surface of the gate insulating layer to oxygen gas plasma, performing a continuous washing process using deionized water, and performing a drying process under a stream of nitrogen gas.

The method further includes performing a re-washing process using deionized water and isopropyl alcohol, and performing a re-drying process under a stream of nitrogen gas, between the coating of the single-wall nanotube and the forming of the source and drain electrodes.

The source and drain electrodes include one of a molybdenum layer, a tungsten layer, and a polyethylene dioxythiophene layer.

The attaching of the thermal release tape after removing the surrounding single-wall nanotube through the reactive ion etching scheme includes primarily coating an insoluble polymer buffer layer before attaching the thermal release tape.

The polyvinyl alcohol thin layer includes polyvinyl alcohol having a molecular weight in a range of 10,000 to 31,000.

The polyvinyl alcohol thin layer is formed by dissolving the polyvinyl alcohol having the molecular weight in pure deionized water, cooling a solution having the dissolved polyvinyl alcohol to a room temperature to extract the solution, containing the extracted solution to a predetermined initial height in a plastic container, removing bubbles from the solution having the dissolved polyvinyl alcohol through pumping after placing the plastic container into a vacuum container, and removing moisture from a bubble-removed polyvinyl alcohol solution using a convection oven or a thermal plate.

In the performing of the transfer onto the polyvinyl alcohol thin layer after etching the nickel thin layer using the iron chloride solution, the transfer is performed using one of poly lacticco-glycolic acid, copolymer of poly lactic acid, poly glycolic acid, and polycaprolactone instead of polyvinyl alcohol.

The convection oven or the thermal plate has a temperature in a range of 50° C. to 80° C.

The gate insulating layer comprises a double-insulating layer or a single insulating layer.

The double insulating layer is formed by sequentially depositing a silicon nitride layer having a thickness in a range of 40 nm to 60 nm and a silicon oxide layer having a thickness in a range of 20 nm to 40 nm.

Details of other embodiments are included in the detailed description and accompanying drawings.

The advantages, the features, and schemes of achieving the advantages and features of the present invention will be apparently comprehended by those skilled in the art based on the embodiments, which are detailed later in detail, together with accompanying drawings. The present invention is not limited to the following embodiments but includes various applications and modifications. The embodiments will make the disclosure of the present invention complete, and allow those skilled in the art to completely comprehend the scope of the present invention.

As described above, according to the present invention, the inverter including the transistor having the high mobility and on/off rate can perform full swing with a high gain under low voltage. In addition, even if the one and two-dimensional nanomaterials are formed in contact with an insulating layer, the performance and the reliability of the semiconductor device can be prevented from being degraded.

DETAILED DESCRIPTION OF THE INVENTION

Hereinafter, an exemplary embodiment of the present invention will be described in detail with reference to accompanying drawings.

The terminology and words used herein and accompanying claims should be not interpreted as the meanings of commonly used dictionaries, but interpreted as having meanings according to the technical spirit of the present invention on the principle that the concepts of the terminology and the words can be defined by the inventor in order to explain the present invention in the best mode.

Throughout the whole specification, when a predetermined part "comprises" or "includes" a predetermined component, the predetermined part does not exclude other components, but may further include other components unless otherwise specified. In addition, the terms "part", "machine", "module", "device", or "step" refer to units to process at least one function or operation, and is realized by hardware or software, or the combination of the hardware and the software.

Figure 1:
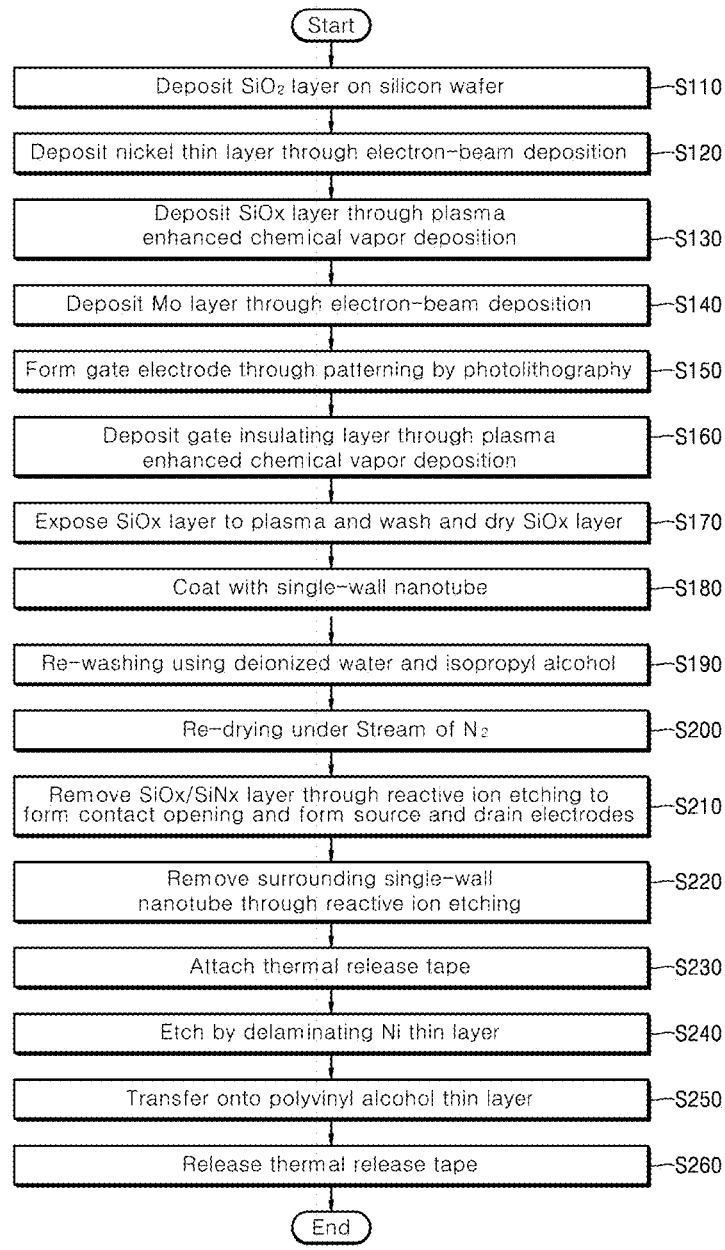
FIG. 1 is a flowchart showing a method of fabricating a transient semiconductor based on a single-wall nanotube according to the present invention.

FIG. 1 is a flowchart showing a method of fabricating a transient semiconductor based on a single-wall nanotube according to the present invention.

Figure 2:
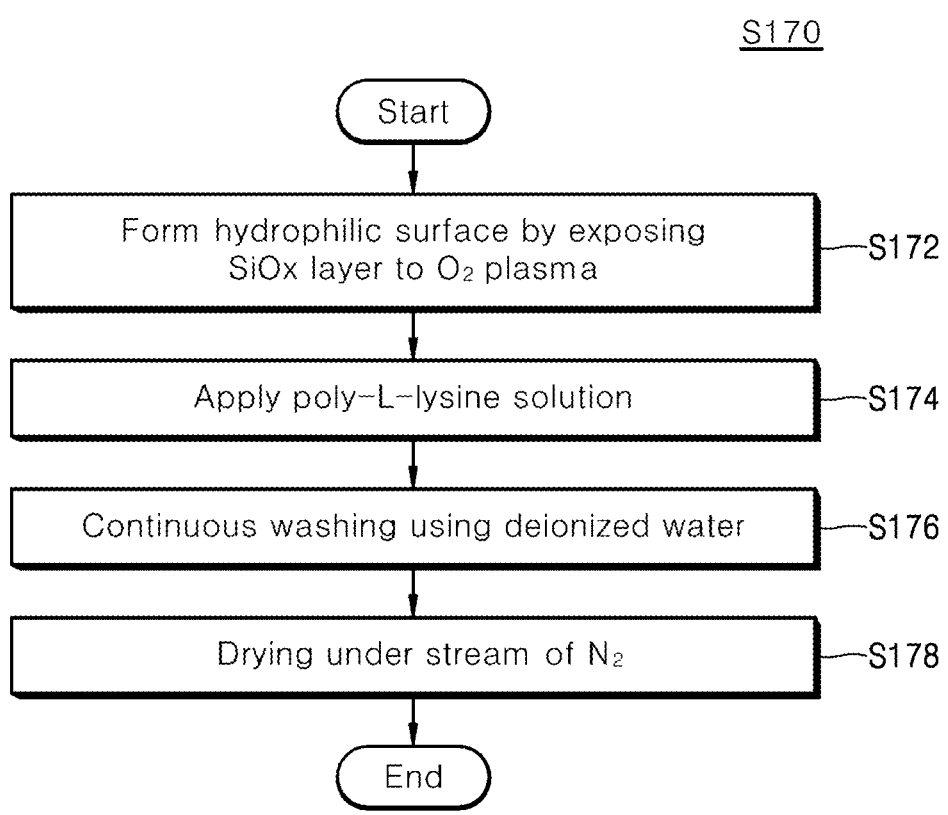
FIG. 2 is a flowchart showing a sub-step of step S170 in the fabricating method shown in FIG. 1.

FIG. 2 is a flowchart showing a sub-step of step S170 in the fabricating method shown in FIG. 1.

Figure 3:
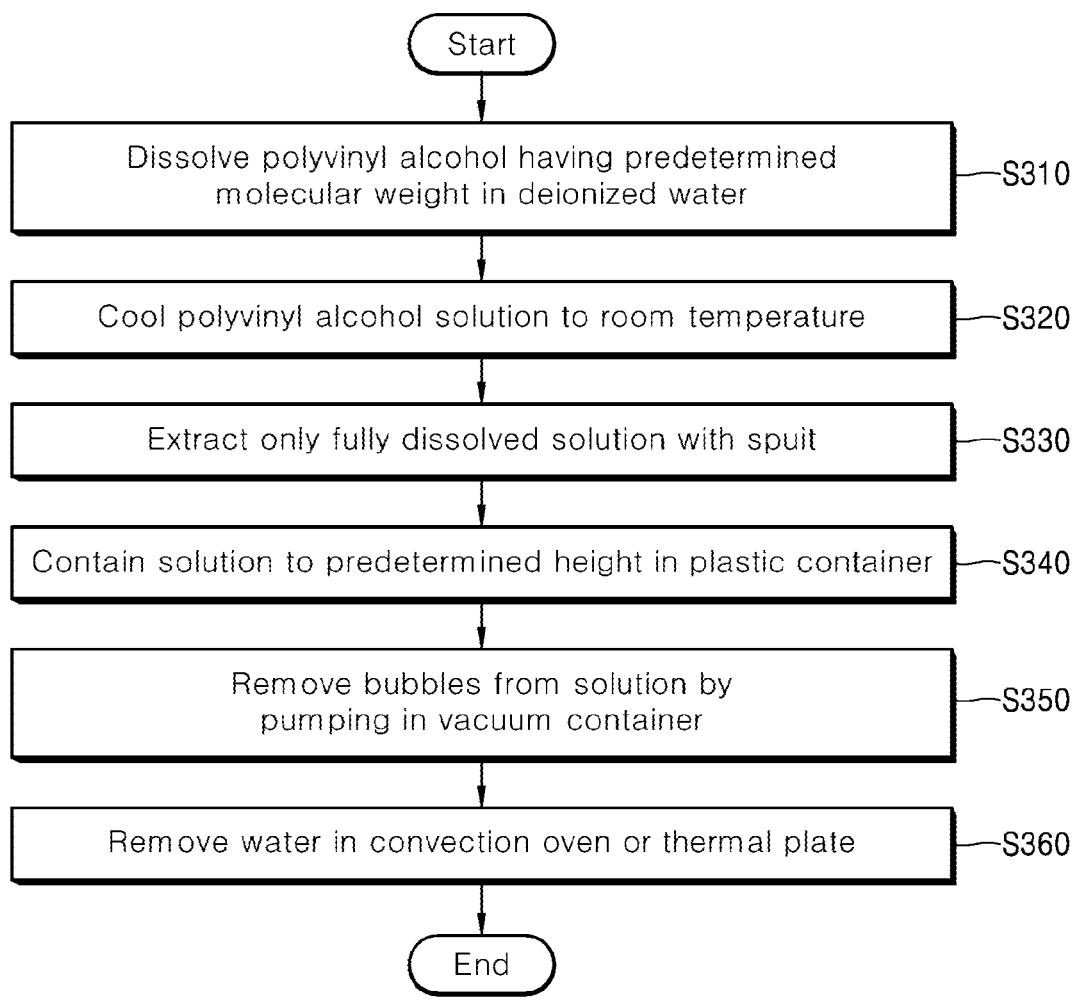
FIG. 3 is a flowchart showing a step of fabricating a polyvinyl alcohol thin film in the fabricating method shown in FIG. 1.

FIG. 3 is a flowchart showing a step of fabricating a polyvinyl alcohol thin film in the fabricating method shown in FIG. 1.

Figure 4:
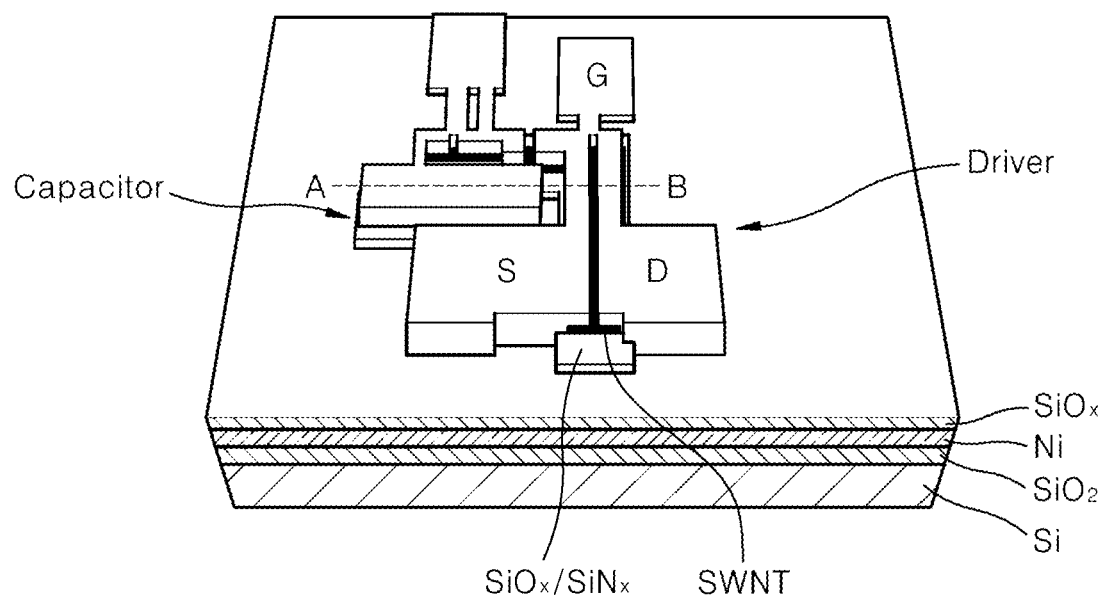
FIG. 4 is a perspective view showing a transient semiconductor based on a single-wall nanotube, which is completely fabricated on a substrate including $SiO_x/Ni/SiO_2/Si$ according to the fabricating method shown in FIG. 1.

FIG. 4 is a perspective view showing a transient semiconductor based on a single-wall nanotube, which is completely fabricated on a substrate including $SiO_x/Ni/SiO_2/Si$ according to the fabricating method shown in FIG. 1.

Figure 5:
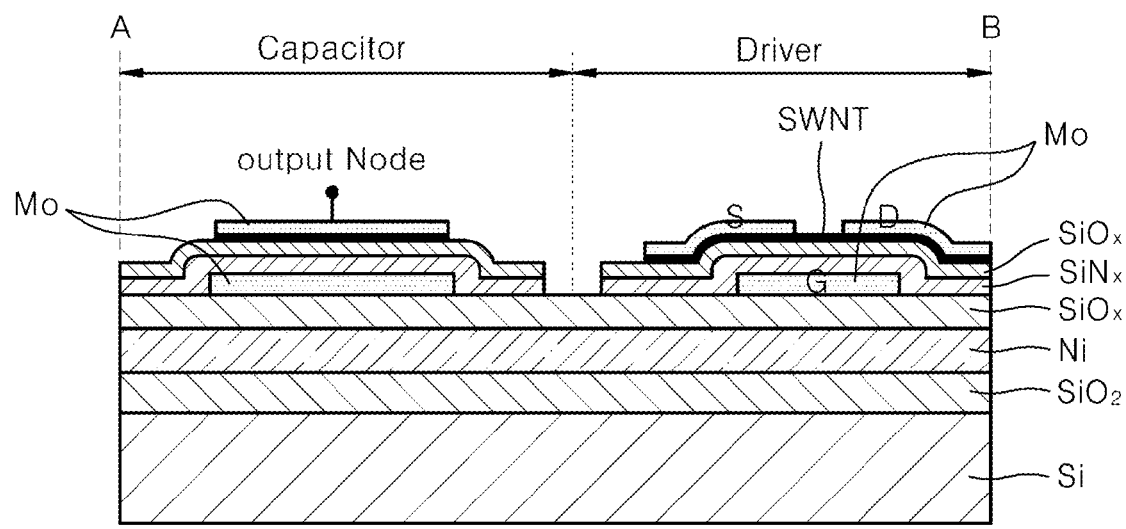
FIG. 5 is a sectional view of the transient semiconductor taken along line A-B of FIG. 4.

FIG. 5 is a sectional view of the transient semiconductor taken along line A-B of FIG. 4.

Figure 6A:
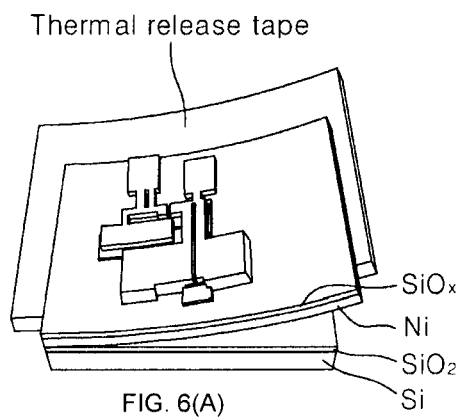
FIGS. 6(a) to 6(f) are photographs showing processes for the transient semiconductor based on the single-wall nanotube fabricated according to the fabricating method shown in FIG. 1.
Figure 6B:
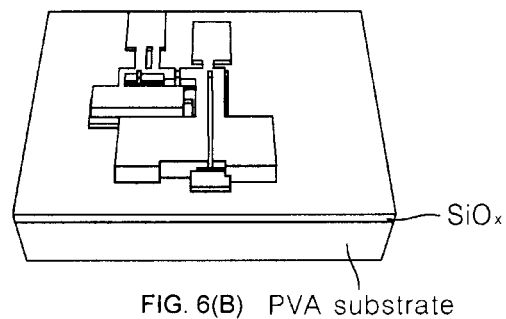
Figure 6C:
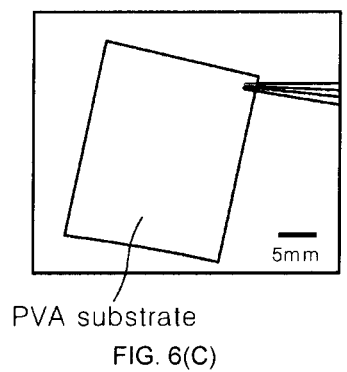
Figure 6D:
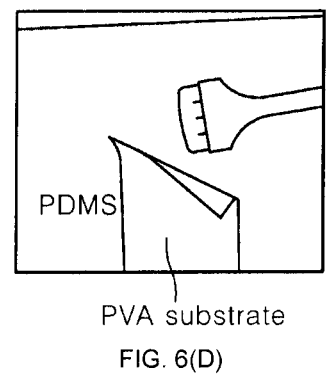
Figure 6E:
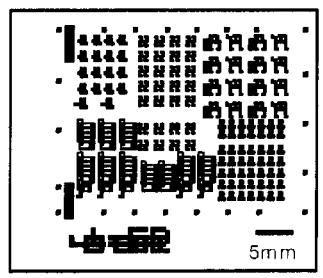
Figure 6F:
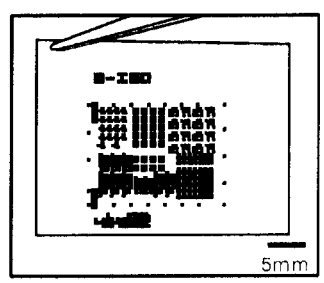

FIGS. 6(a) to 6(f) are photographs showing processes for a transient semiconductor based on a single-wall nanotube fabricated according to the fabricating method shown in FIG. 1. FIG. 6(a) is a photograph showing the recovery of a device completely fabricated under water using a thermal release tape. FIG. 6(b) is a photograph showing a device transferred onto a polyvinyl alcohol substrate after etching Ni residues from a rear surface of a single-wall nanotube device/SiOx substrate. FIG. 6(c) is a photograph showing a polyvinyl alcohol substrate prepared by dropping an aqueous polyvinyl alcohol solution. FIG. 6(d) is a photograph showing a stack on a glass slide coated with PDMS for a transfer printing process. FIG. 6(e) is a photograph showing a field effect transistor based on a single-wall nanotube completely fabricated on a Si substrate triply coated with $SiOx/Ni/SiO_2$ before recovery. FIG. 6(f) is a photograph showing the device after transferred onto the polyvinyl alcohol substrate.

Hereinafter, a method of fabricating a transient semiconductor based on a single-wall nanotube according to the present invention will be described with reference to FIGS. 1 to 6.

Silicon oxide ($SiO_2$) constituting a thermal oxide layer is stacked on a silicon substrate (S110), and a thickness of the thermal oxide layer may be set to be in the range of 250 nm to 350 nm, preferably, 300 nm.

A nickel thin layer is deposited on the thermal oxide layer through e-gun evaporation or sputtering (S120). A thickness of the nickel thin layer may be set to be in the range of 250 nm to 350 nm, preferably, 300 nm.

The oxide silicon ($SiO_x$) serving as a plasma enhanced chemical vapor deposition (PECVD) layer is deposited with the thickness in the range of 100 nm to 300 nm on the nickel thin layer at 300° C. through a PECVD process (S130).

The PECVD process scheme is a thin layer composition method which forms plasma in a reaction chamber to smoothly make a reaction and help the deposition.

After depositing a water-soluble metallic layer formed of molybdenum (Mo), tungsten (W), or polyehylenedioxythiophene (PEDOT) to the thickness in the range of 60 nm to 80 nm through an electron-beam deposition process (S140), the water-soluble metallic layer is patterned through a photolithography scheme to form a gate electrode (S150).

The gate insulating layer is deposited on the gate electrode through the PECVD process (S160).

In this case, the gate insulating layer may be a double-insulating layer ($SiN_x$ and $SiO_x$) or a single insulating layer ($SiN_x$ or $SiO_x$).

The thickness of the $SiN_x$ may be set in the range of 40 nm to 60 nm, preferably to 50 nm, and the thickness of the $SiO_x$ may be set in the range of 20 nm to 40 nm, preferably, to 30 nm.

The $SiO_x$ is exposed to oxygen gas ($O_2$) plasma of 30 W for 8 minutes to 12 minutes, and subject to surface treatment for 30 minutes or less in an ultraviolet ozone generator so that the surface of the gate insulating layer to be coated with nonotubes is changed to the surface having a hydrophilic property (S172).

The substrate including the gate insulating layer having the hydrophilic surface is dipped into a poly-L-lysine solution for four minutes to 10 minutes (S174), a functional group of $NH_2$ is formed on the surface of the gate insulating layer, and the interfacial charges have positive polarity.

The gate insulating layer is continuously washed (S176) using the deionized water DI and dried under the stream of nitrogen gas ($N_2$) (S174) so that the surface of the gate insulating layer is coated with single-wall nanotubes spatially uniformly at a controlled density (S180).

In this case, the surface of the gate insulating layer may be coated with a nanowire (including ZnO, CuO, or SnO) having one-dimensional structure and a semiconductor characteristic instead of a single-wall nanotube.

This process is to prepare a structure for transfer, and includes processes of pressing a tape having a circuit onto a rear surface of the polyvinyl alcohol thin layer having the thickness of 30 μm as shown in FIG. 6(c), and maintaining the tape on a glass slide through the coating with polydimethylsiloxane (PDMS) as shown in FIG. 6(d).

The resultant structure is washed using DI and isopropyl alcohol (IPA) (S190), and re-dried under the stream of the nitrogen gas ($N_2$) (S200).

The gate insulating layer (including $SiO_x$ and/or $SiN_x$) is removed through a reactive ion etching (RIE) process using $O_2/CF_4$ to generate a contact opening, so that the source electrode and the drain electrode are formed (S210).

Finally, surrounding single-wall nanotubes are removed by performing the RIE process using $O_2$ under pressure of 90 mTorr to 110 mTorr with power of 60 W to 80 W for 50 seconds to 70 seconds (S220).

As described above, a thermal release tape is attached onto the final device to easily delaminate the completed electronic device substrate from a rigid substrate such as the silicon substrate or the glass substrate under water as shown in FIG. 6(a) (S230), and Ni is removed from the rear surface of the device through the etching process using an iron chloride solution (S240).

In this case, the thermal release tape may be attached after an insoluble polymer buffer layer including polymethylmethacrylate (PMMA) is primarily coated.

In addition, as shown in FIG. 6(b), the transfer is performed onto the polyvinyl alcohol (PVA) thin layer (S250), and the thermal release tape is released through the heating on a thermal plate with the temperature of 100° C. (S260).

According to the present embodiment, although the polyvinyl alcohol is used for the illustrative purpose, poly lacticco-glycolic acid (PLGA), copolymer of poly lactic acid (PLA), poly glycolic acid (PGA), or polycaprolactone (PCL) may be used instead of the polyvinyl alcohol.

In this case, the polyvinyl alcohol having a molecular weight in a range of 10,000 to 31,000 and a thickness in the range of 15 nm to 25 nm, preferably, 20 nm is used.

If the molecular weight of the polyvinyl alcohol is 31,000 or more, the polyvinyl alcohol is harmful to the human body due to the toxicity.

A method of forming the polyvinyl alcohol thin layer with the polyvinyl alcohol having the above-described molecular weight is as follows.

As shown in FIG. 3, the polyvinyl alcohol is dissolved in pure deionized water to prepare solution having concentration of 10 wt % (S310).

In other words, in state that the solution in a glass container such as a beaker is maintained at a temperature of 60° C. to 70° C. while being stirred with a magnetic bar, the polyvinyl alcohol is sufficiently dissolved for at least 12 hours.

In this case, the polyvinyl alcohol is dissolved with the minimum of vents in the state that aluminum foil or a glass lid is covered to prevent deionized water from being evaporated.

After the dissolved polyvinyl alcohol solution is cooled to the room temperature in air (S320), only the fully dissolved transparent solution is extracted with a spuit (S330).

The extracted solution is contained in a plastic container having a flat bottom or an SUS-based container to have an initial height of 1 mm to 5 mm (S340).

The thickness of the final polyvinyl alcohol thin layer is controlled in the range of several μm to several hundred μm according to the initial height of the solution.

Bubbles are removed from the polyvinyl alcohol solution through pumping under low vacuum pressure of several tens mTorr for 10 minutes to 20 minutes after placing a plastic container containing the polyvinyl alcohol solution into a vacuum container (S350).

If the above-described steps are not performed, a pinhole is formed in the polyvinyl alcohol thin layer so that a uniform polyvinyl alcohol thin layer may not be formed.

Then, the plastic container containing the evenly maintained polyvinyl alcohol solution is placed in a convection oven or on a thermal plate and moisture is removed from the polyvinyl alcohol solution while a temperature is maintained in the range of 50° C. to 80° C. (S360).

When the temperature is lower than 50° C., a long time is required to form the polyvinyl alcohol thin layer and a wrinkle is formed in the final polyvinyl alcohol thin layer, so that it is difficult to achieve a desired flatness. When the temperature is higher than 80° C., the thickness of the formed polyvinyl alcohol thin layer is not uniform or a deep wrinkle is formed in the polyvinyl alcohol thin layer.

After transferring the transient semiconductor based on the single-wall nanotube, which includes silicon and nickel of FIG. 4, on the polyvinyl alcohol thin layer shown in FIG. 6(c), a transient field effect transistor circuit based on the single-wall nanotube is completed as shown in FIG. 6(f).

Figure 7:
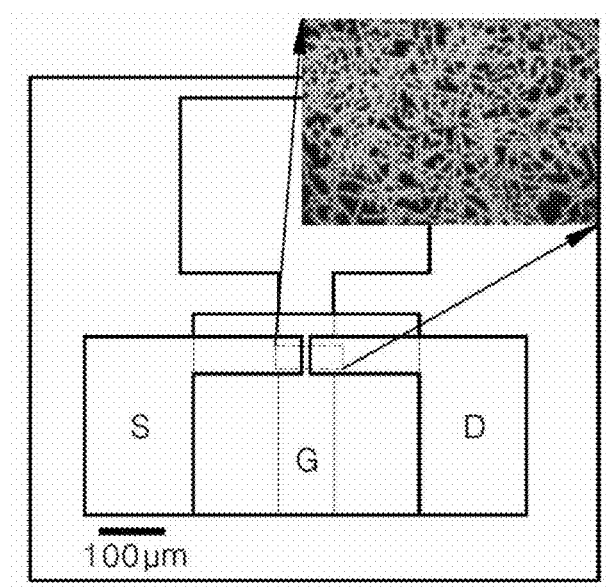
FIG. 7 is an optical microscope showing a typical field-effect transistor for a single-wall nanotube fabricated to have a Mo or Ti/Pd contact on $SiO_x/Ni/SiO_2/Si$ in the fabricating method shown in FIG. 1.

FIG. 7 is an optical microscope showing a typical field-effect transistor for a single-wall nanotube fabricated to have a Mo or Ti/Pd contact on $SiOx/Ni/SiO_2/Si$ in the fabricating method shown in FIG. 1.

Figure 8A:
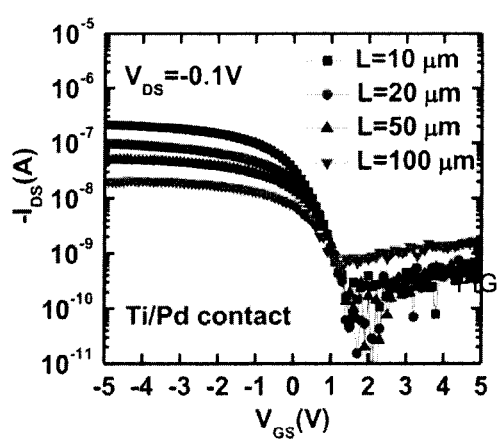
FIGS. 8(a) and 8(b) are graphs showing transfer characteristics according to various channel lengths of 10 μm to 100 μm under a drain-source voltage (VDS) of 0.1 V with respect to a device having a Ti/Pd contact and a device having an Mo contact according to the fabricating method shown in FIG. 1.
Figure 8B:
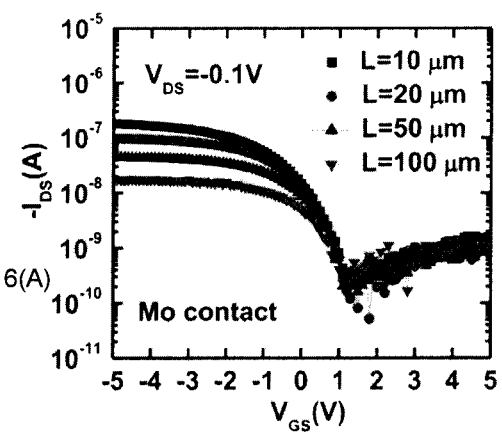

FIGS. 8(a) and 8(b) are graphs showing transfer characteristics according to various channel lengths of 10 μm to 100 μm under a drain-source voltage (VDS) of 0.1 V with respect to a device having a Ti/Pd contact and a device having an Mo contact according to the fabricating method shown in FIG. 1.

Figure 9A:
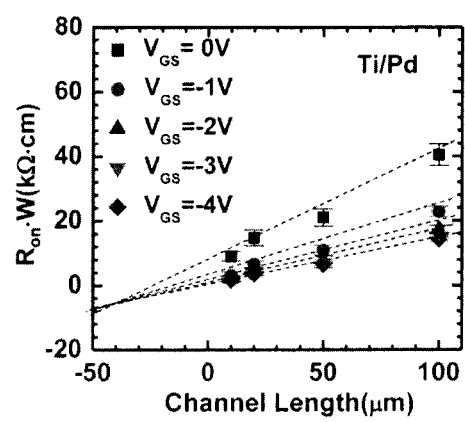
FIGS. 9(a) and 9(b) are graphs showing total contact resistances of Ron to $2R_{S/D}+r_{ch}L$ of field effect transistors for single-wall nanotubes, which have a Ti/Pd contact and an Mo contact, respectively, according to various channel lengths of 10 μm to 100 μm as a function of a gate-source voltage (VGS) according to the fabricating method shown in FIG. 1.
Figure 9B:
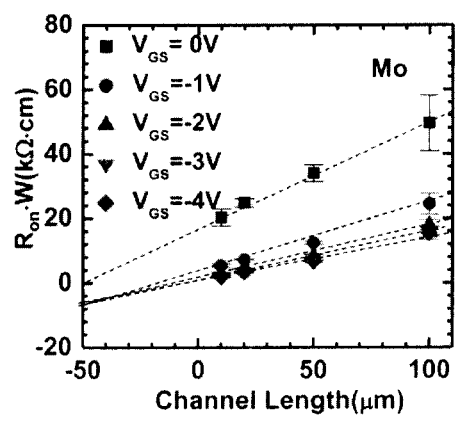

FIGS. 9(a) and 9(b) are graphs showing total contact resistances of Ron to $2R_{S/D}+r_{ch}L$ of field effect transistors for single-wall nanotubes, which have a Ti/Pd contact and an Mo contact, respectively, according to various channel lengths of 10 μm to 100 μm as a function of a gate-source voltage (VGS) according to the fabricating method shown in FIG. 1.

Figure 10:
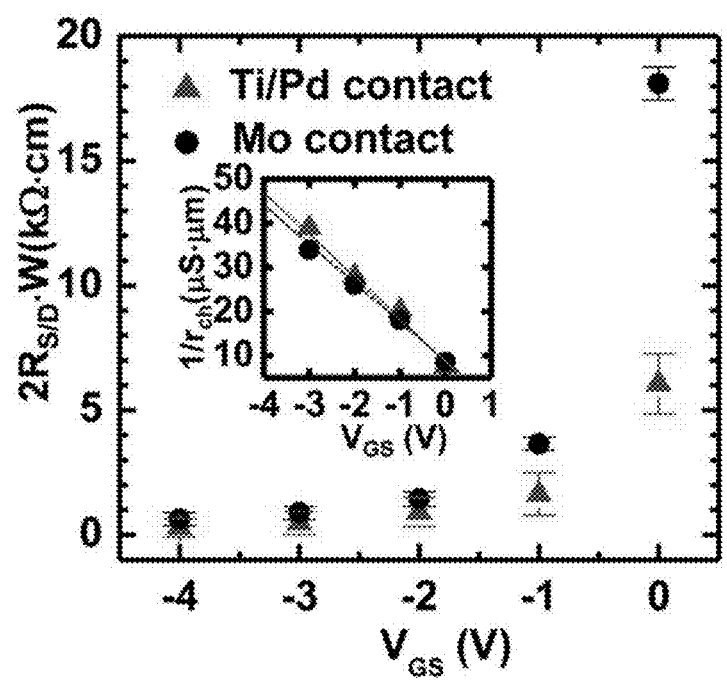
FIG. 10 is a graph showing a contact resistance extracted from a field effect transistor having a Ti/Pd contact or an Mo contact in a gate transmission line scheme according to the fabricating method shown in FIG. 1.

FIG. 10 is a graph showing a contact resistance extracted from a field effect transistor having a Ti/Pd contact or an Mo contact in a gate transmission line scheme according to the fabricating method shown in FIG. 1.

As shown in FIGS. 8(a) to 10, the comparison between the Ti/Pd case and the Mo case indicates the difference between contact characteristics, and the total device resistance (Ron) may be expressed as the sum of a channel resistance ($r_{ch}L$) per channel length and a contact resistance ($R_{S/D}$) related to the source and drain electrodes in the linear system.

In general, since an N-type single-wall nanotube transistor is not relatively reliable, a P-type single-wall nanotube transistor typically operates in a stable state under air.

Therefore, a basic logic device such as an enhancement-load inverter including a conventional diode-connected load is generally used.

Although this is a simple scheme, threshold voltage drop may significantly reduce a logic swing and a noise margin at a source terminal.

It can be recognized from FIG. 10 that "inset" depends on a gate-source voltage VGS which is an average value of a reciprocal number of a unit channel resistance. In addition, it can be recognized that the gradients for the field effect transistors having the Ti/Pd contact and the Mo contact are similar to experimental errors.

Figure 11:
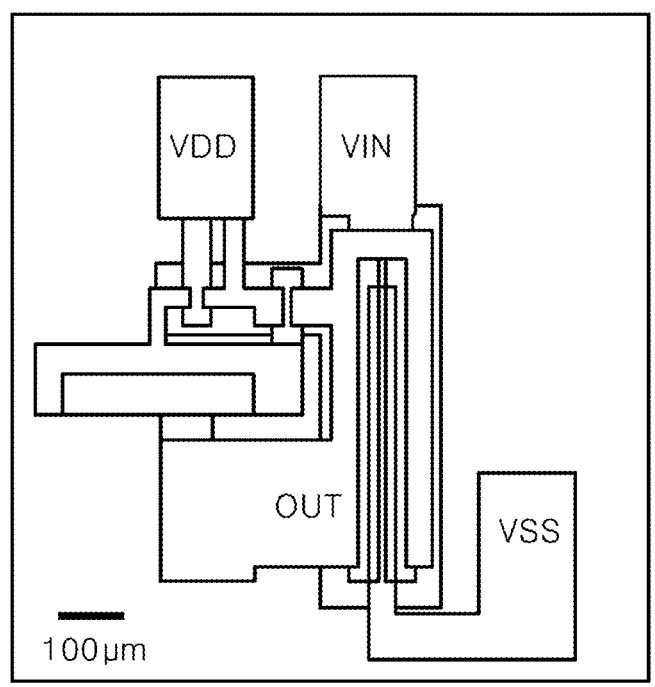
FIG. 11 is an optical microscope showing a transient semiconductor based on a single-wall nanotube completed according to the fabricating method shown in FIG. 1.

FIG. 11 is an optical microscope showing the transient semiconductor based on the single-wall nanotube completed according to the fabricating method shown in FIG. 1.

Figure 12:
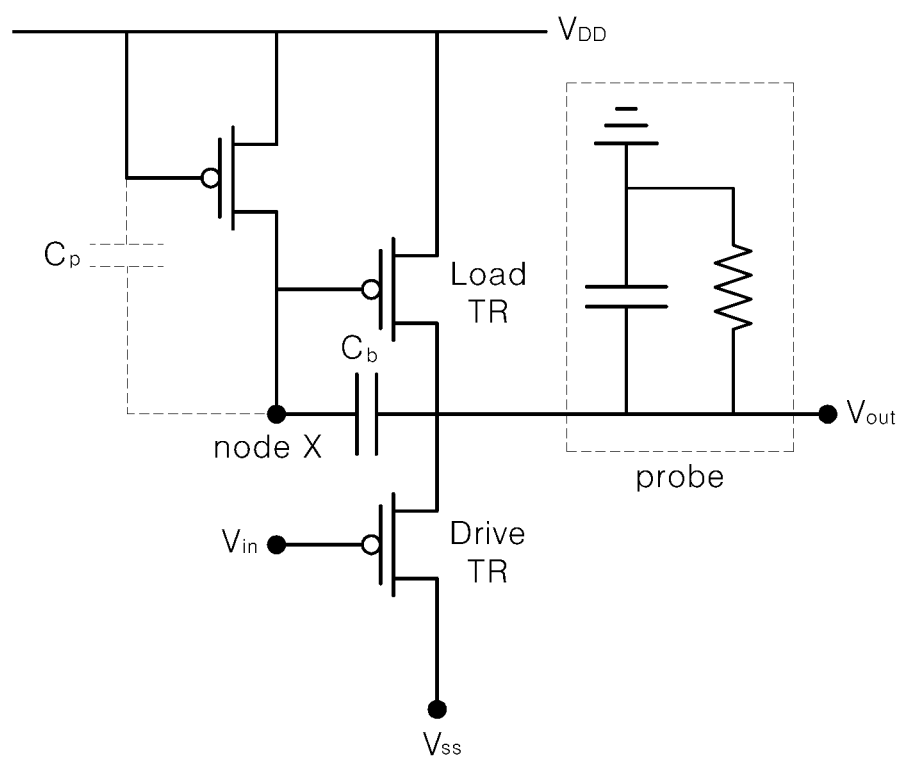
FIG. 12 is a circuit diagram showing a bootstrap inverter using a transient transistor based on a single-wall nanotube completed according to the fabricating method shown in FIG. 1.

FIG. 12 is a circuit diagram showing a bootstrap inverter using the transient transistor based on the single-wall nanotube completed according to the fabricating method shown in FIG. 1.

Figure 13A:
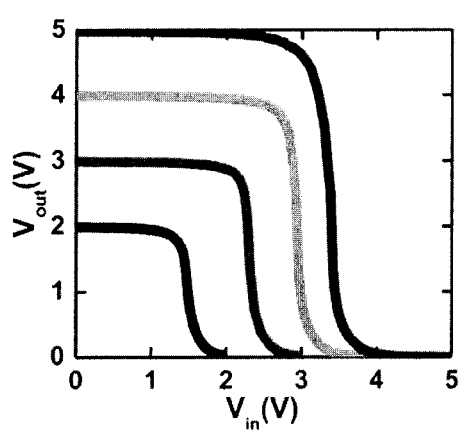
FIGS. 13(a) and 13(b) are graphs showing a DC voltage transfer characteristic and an AC dynamic response of the boot strap inverter shown in FIG. 12, respectively.
Figure 13B:
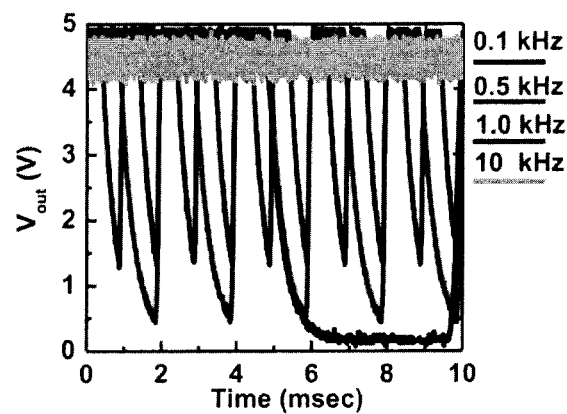
Figure 14A:
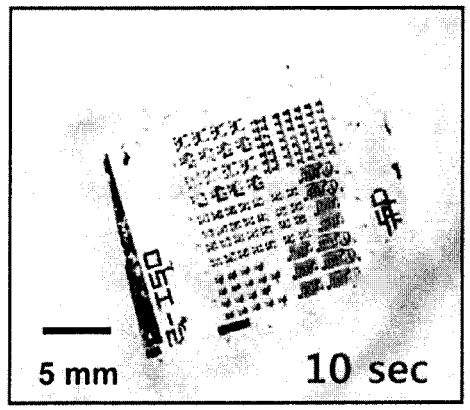
FIGS. 14(a) to 14(d) are photographs showing the dissolution of a transient semiconductor based on a single-wall nanotube, which is completed according to the fabricating method shown in FIG. 1, in deionized water at a room temperature in time-series.
Figure 14B:
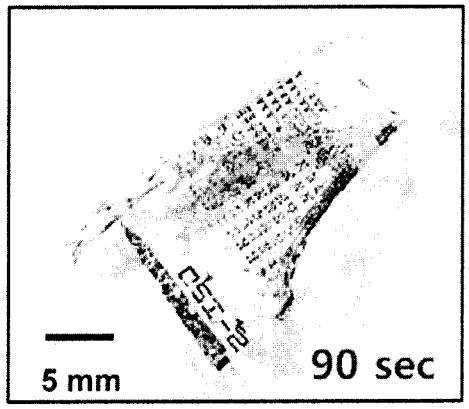
Figure 14C:
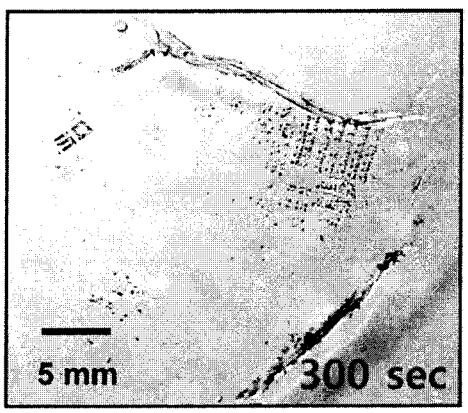
Figure 14D:
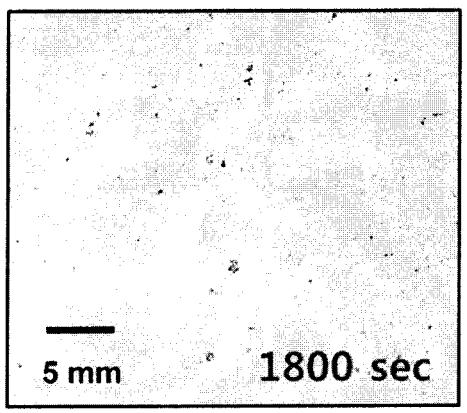

FIGS. 13(a) and 13(b) are graphs showing a DC voltage transfer characteristic and an AC dynamic response of a bootstrap inverter shown in FIG. 12, respectively.

As shown in FIGS. 11 and 12, a driver transistor (width/length=600/10 μm), a load transistor (width/length=40/10 μm), a gate diode (width/length=20/10 μm), and a bootstrap single-wall nanotube inverter including a bootstrap condenser (5.2 pF) are used, and the influence by probing loads including an internal resistance and the capacitance of an oscillator are exerted.

As shown in FIG. 13(b), the maximum gain (dVout/dVin) max) is 30 in relation to VDD of 0 V and supply voltage VSS of 2 V to 5 V.

This operation is based on a bootstrapping operation, and a high-rate driving and load transistor is used.

The bootstrap may compensate for voltage drop, which is related to a threshold voltage (Vth), with respect to a load transistor to reduce voltage intensity under low output voltage (VOL) during an inverter operation.

This function reduces falling time by boosting a transition operation during transition from a high level to a low level.

The design for the ratio of the width of the driver field effect transistor to the width of the load field effect transistor is important since the ratio may determine the maximum gain and the high output voltage (VOH).

FIGS. 12 and 13 show a dynamic operation in the case of a square wave (f=100 Hz, and a duty cycle (DC)=0.5) having the amplitude of 5V applied to an input node under the bias condition that VSS=5V and VDD=0V.

As the frequency is increased from 0.1 kHz to 10 kHz in the state that other parameters are fixed, the switching operation is slowly suppressed due to a propagation delay.

This limitation is caused by parasitic capacitances of the driver and load transistors as well as the electrical connection between the oscilloscope and the inverter output node.

The rising and falling times are 0.35 ms and 1.51 ms at 100 Hz, respectively, which represents that the current of the load field effect transistor (width/length=40/10 μm) lower than that of the driver field effect transistor (width/length=600/10 μm) prolongs time to discharge charges stored in the parasitic capacitor formed due to the connection between the oscilloscope and a connection line.

FIGS. 14(a) to 14(d) are photographs showing the dissolution of the transient semiconductor based on the single-wall nanotube, which is completed according to the fabricating method shown in FIG. 1, in the deionized water at a room temperature in time-series. FIGS. 14(a) to 14(d) show various steps of the dissolution and the hydrolysis of the single-wall nanotube field effect transistor and the bootstrap inverter on the polyvinyl alcohol substrate in the cases of 10 sec, 90 sec, 300 sec, and 1800 sec, respectively.

As shown in FIGS. 14(a) to 14(d), after the polyvinyl alcohol substrate (30 μm) has been slowly dissolved within 30 minutes, remaining components including $SiO_x$, $SiN_x$ and Mo are disappeared at different speeds due to hydrolysis.

Timing that the single-wall nanotubes are dispersed, agglomerated in a small mass, dissolved, and decomposed may be programmed based on not only a packing scheme after copulating, film-decomposing and/or drop-casing, but also the selection of a physical dimension, a layer thickness, and a material for a single-wall nanotube circuit, which can be confirmed through an experiment.

As described above, according to the method of fabricating the transient semiconductor based on the single-wall nanotube, the inverter including the transistor having the high mobility and on/off rate may perform full swing with a high gain under low voltage by transferring a semiconductor, which has a transient single-wall nanotube electron structure decomposed under water, to the polyalcohol thin layer having a predetermined molecular weight.

In addition, even if the one and two-dimensional nano-materials are formed in contact with an insulating layer, the performance and the reliability of the semiconductor device may be prevented from being degraded.

Although an exemplary embodiment of the present invention has been described for illustrative purposes, those skilled in the art will appreciate that various modifications, additions and substitutions are possible, without departing from the scope and spirit of the invention as disclosed in the accompanying claims.

What is claimed is:

1. A method of fabricating a transient semiconductor based on a single-wall nanotube, the method comprising:

(a) stacking a thermal oxide layer on a silicon substrate and depositing a nickel thin layer on the thermal oxide layer;

(b) depositing an oxide layer on the nickel thin layer through a plasma enhanced chemical vapor deposition scheme;

(c) depositing a metallic layer on the oxide layer through an electron-beam deposition scheme, and patterning the metallic layer through a photolithography scheme to form a gate electrode;

(d) depositing a gate insulating layer on the gate electrode through the plasma enhanced chemical vapor deposition scheme;

(e) changing a surface of the gate insulating layer into a hydrophilic surface through plasma treatment or ultra-violet ozone treatment, and washing and drying the gate insulting layer;

(f) coating a single-wall nanotube on the hydrophilic surface of the gate insulating layer;

(g) forming source and drain electrodes by forming a contact opening through a reactive ion etching scheme for the gate insulating layer;

(h) attaching a thermal release tape after removing a surrounding single-wall nanotube through the reactive ion etching scheme;

(i) performing a transfer onto a polyvinyl alcohol thin layer after etching the nickel thin layer using an iron chloride solution; and (j) releasing the thermal release tape on a thermal plate.

2. The method of claim 1, wherein the coating of the single-wall nanotube on the hydrophilic surface of the gate insulating layer comprises:

pressing a tape having a circuit on an opposite surface of the polyvinyl alcohol thin layer; and coating polymethylmethacrylate (PDMS) onto a glass slide.

3. The method of claim 1, wherein, in the coating of the single-wall nanotube on the hydrophilic surface of the gate insulating layer, a nanowire having a one-dimensional structure and a semiconductor characteristic is coated instead of the single-wall nanotube.

4. The method of claim 1, wherein the nickel thin layer has a thickness in a range of 250 nm to 350 nm.

5. The method of claim 1, wherein the forming of the source and drain electrodes by forming the contact opening through the reactive ion etching scheme for the gate insulating layer comprises:

applying a poly-L-lysine solution;

exposing the surface of the gate insulating layer to oxygen gas plasma;

performing a continuous washing process using deionized water; and performing a drying process under a stream of nitrogen gas.

6. The method of claim 1, further comprising:

performing a re-washing process using deionized water and isopropyl alcohol; and performing a re-drying process under a stream of nitrogen gas, between the coating of the single-wall nanotube and the forming of the source and drain electrodes.

7. The method of claim 1, wherein the source and drain electrodes include one of a molybdenum layer, a tungsten layer, and a polyethylene dioxythiophene layer.

8. The method of claim 1, wherein the attaching of the thermal release tape after removing the surrounding single-wall nanotube through the reactive ion etching scheme comprises primarily coating an insoluble polymer buffer layer before attaching the thermal release tape.

9. The method of claim 1, wherein the polyvinyl alcohol thin layer includes polyvinyl alcohol having a molecular weight in a range of 10,000 to 31,000.

10. The method of claim 9, wherein the polyvinyl alcohol thin layer is formed by:
dissolving the polyvinyl alcohol having the molecular weight in pure deionized water;
cooling a solution having the dissolved polyvinyl alcohol to a room temperature to extract the solution;
containing the extracted solution to a predetermined initial height in a plastic container;
removing bubbles from the solution having the dissolved polyvinyl alcohol through pumping after placing the plastic container into a vacuum container; and
removing moisture from a bubble-removed polyvinyl alcohol solution using a convection oven or the thermal plate.

11. The method of claim 1, wherein, in the performing of the transfer onto the polyvinyl alcohol thin layer after etching the nickel thin layer using the iron chloride solution, the transfer is performed using one of poly lacticco-glycolic acid, copolymer of poly lactic acid, poly glycolic acid, and polycaprolactone instead of polyvinyl alcohol.

12. The method of claim 10, wherein the convection oven or the thermal plate has a temperature in a range of 50° C. to 80° C.

13. The method of claim 1, wherein the gate insulating layer comprises a double-insulating layer or a single insulating layer.

14. The method of claim 13, wherein the double insulating layer is formed by sequentially depositing a silicon nitride layer having a thickness in a range of 40 nm to 60 nm and a silicon oxide layer having a thickness in a range of 20 nm to 40 nm.

* * * * *